United States Patent [19]

Suzuki

[11] Patent Number: 4,656,614
[45] Date of Patent: Apr. 7, 1987

[54] MULTIPLE SIMULTANEOUS ACCESS MEMORY

[76] Inventor: Naruhito Suzuki, 1555-1, Tsurogasone, Yashio-shi, Saitama, 340, Japan

[21] Appl. No.: 637,050
[22] PCT Filed: Nov. 24, 1983
[86] PCT No.: PCT/JP83/00418
§ 371 Date: Jul. 25, 1984
§ 102(e) Date: Jul. 25, 1984
[87] PCT Pub. No.: WO84/02222
PCT Pub. Date: Jun. 7, 1984

[30] Foreign Application Priority Data

Nov. 27, 1982 [JP] Japan .................................. 57-208303

[51] Int. Cl.4 ................................................ G11C 8/00
[52] U.S. Cl. ...................................... 365/230; 365/189
[58] Field of Search ................................ 365/189, 230

[56] References Cited

U.S. PATENT DOCUMENTS 4,287,575 9/1981 Eardley et al. ...................... 365/189
4,488,264 12/1984 Dshkhunian et al. ............... 365/230

Primary Examiner—James W. Moffitt
Attorney, Agent, or Firm—Hoffman, Wasson & Fallow

[57] ABSTRACT

A random access memory for simultaneously reading or writing information into or from two memory cells in a memory matrix. At least two address control lines and two input/output data lines are provided for each cell of the memory matrix. Each cell is accessed independently through an arbitrary address control line. The particular input/output data line corresponding to the correct address control line is energized, thereby simultaneously accessing two memory cells.

5 Claims, 10 Drawing Figures

MULTIPLE SIMULTANEOUS ACCESS MEMORY

FIELD OF ART

The present invention relates to a multiple simultaneous access memory, particularly to a memory to enable multiple processing in memory circuit, and quick data transfer by addressing two or more memory cells to simultaneously access.

BACKGROUND OF ART

A memory device is having at least one input line(s) to specify a next status to be, and having at least one output line(s) to know what kind of status it is now in. This definition can be applied to random access memory with arrangement of semiconductor memory devices in the form of matrix, as well as, widely to sequential access memory such as magnetic disk, magnetic drum, magnetic tape and the like. Hereinafter, there is illustrated, for example, a RS flip flop of matrix arrangement as a representative of memory device.

FIG. 1 shows a basic structure of the prior art memory device.

Where memory 1 comprises, for example, of 4×4 bit memory cells, two bits of lower-order position among the four bits of address signals are used for X decoder 2 to specify the position in X coordinate, selecting from 2×2=4 positions, and two bits of the higher-order position are used for Y-decoder 3 to specify the position in Y-coordinate, selecting from 4 positions, thereby to select the memory cell at the location determined by X-position and Y-position. Simultaneously, the instruction of reading(R) or writing(W) is set. In case of writing(W), data to be written enters(DATA in). In case of reading, data to be read is picked out(DATA out). Consequently, the conventional memory can address only one cell at the same time, and therefore, only one cell among 4×4 bit memory cells can be accessed to read or write. As usual, in memory called "dual port memory" with connection to two buses, address is instructed independently from the two buses, but in this device the two address signals are rearranged in time series signal to access into the memory cells, and therefore, it is not simultaneous access, but only serial access.

FIG. 2 shows the internal structure of the memory of FIG. 1.

The prior art 4×4 bit memory is as shown in FIG. 2 comprised of sixteen memory cells 11, each of which 11 is connected to each one of address lines(0-3) in Y coordinate and one of address lines in X coordinate, as well as, to input/output data lines. As shown in FIG. 2, signal of read/write control line allows output of input-/output data line valid in case of reading, and allows the input valid in case of writing. In each of the memory cells 11, the commands of X address and Y address are applied to AND gate 13, thereby, the output "1" signal activates the flip-flop 12, at the same time, the signal representing set or reset status of the addressed cell is fetched out, or the signal to set or reset status of the addressed cell is put into the memory cell, depending on read or write instructions.

FIG. 3 is a logical diagram of flip-flop content of FIG. 2.

As described above, X address signal and Y address signal are applied to AND gate, and when this flip-flop 12 is selected, "1" output is sent from AND gate 13 to NAND gates 14 and 15 of the flip-flop 12. NAND gates 16 and 17 make a latch circuit and the input stage for writing data in NAND gate 14 and 15, and the output stage for reading data in AND gate 18 are connected respectively to before and after stage of latch circuit.

On the other hand, in case of reading, input/output data lines functions as an output line by instructing to read, so that input signal(DATA IN) is cut off, and output signal(DATA OUT) will be "1" or "0", depending on the stored data in memory cell. In case of writing, input/output data lines functions as an input line where it instructs to read. Therefore, input signal(DATA IN) is "1" or "0" to be written. Output signal(DATA OUT) is the stored data which has been written, but it is not fetched through the input/output data line, thereby to cut off signal. Therefore, the operation of flip-flop 12 is as follows;

When not-selected:
| "1" | gate 14 output "1" | gate 16 output "1". |
| "1" | gate 15 output "1" | gate 17 output "0". |
| "0" | gate 14 output "1" | gate 16 output "0". |
| "0" | gate 15 output "1" | gate 17 output "1". |

When written:
| "1" | gate 14 output "0" | gate 16 output "1". |
| "1" | gate 15 output "1" | gate 17 output "0". |
| "0" | gate 14 output "1" | gate 16 output "0". |
| "0" | gate 15 output "0" | gate 17 output "1". |

When read:
| "1" | gate 14 output "1" | gate 16 output "1". |
| "1" | gate 15 output "1" | gate 17 output "0". |
| "0" | gate 14 output "1" | gate 16 output "0". |
| "0" | gate 15 output "1" | gate 17 output "1". |

In the above mentioned prior art memory, even when requests for access rush in, actually only one request can be satisfied to access at the same time, so that processing time can not be lowered. Furthermore, where memory is used alternatively and independently for CPU or I/O device, the fact is that if one is occupied, the other is waiting, and therefore, the efficiency of utility can not increase.

The object of the present invention is to remove such defects of the prior art device, by multiple simultaneous parallel access to enable multiple processing of memory, and high speed transfer of data, and further to provide a multiple simultaneous access memory to allow independent buffer-transfer by input/output device on CPU processing.

DISCLOSURE OF INVENTION

The inventive multiple simultaneous access memory comprises two or more address control lines and input-/output data lines for each bit of memory cell. It is accessed independently through an arbitrary address control line, and energizes the input/output data line corresponding to the address control line, thereby to instruct simultaneously multi-access the memory cells to allow multiple processing in memory device.

In the inventive device, the input/output data line(s) are mutually connected through gate circuit to allow the read data written in the other memory cell(s) as an input data, so that data can be obtained directly without use of CPU, even in case of indirect access.

Further, in accordance with the present invention, the input/output data lines are connected to the other address control lines thereby to store the read data in the memory cells specified by addressing, so that it enables internal data transfer in the memory.

SIMPLE DESCRIPTION OF DRAWING

Figure 1:
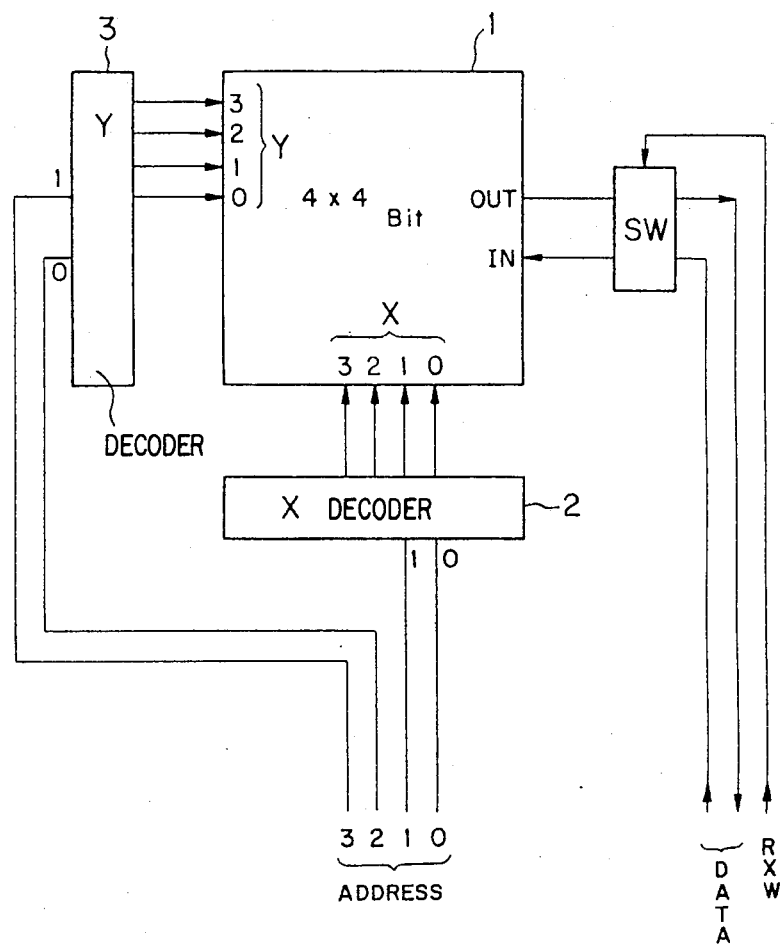
FIG. 1 shows a basic structure of the prior art memory.
Figure 2:
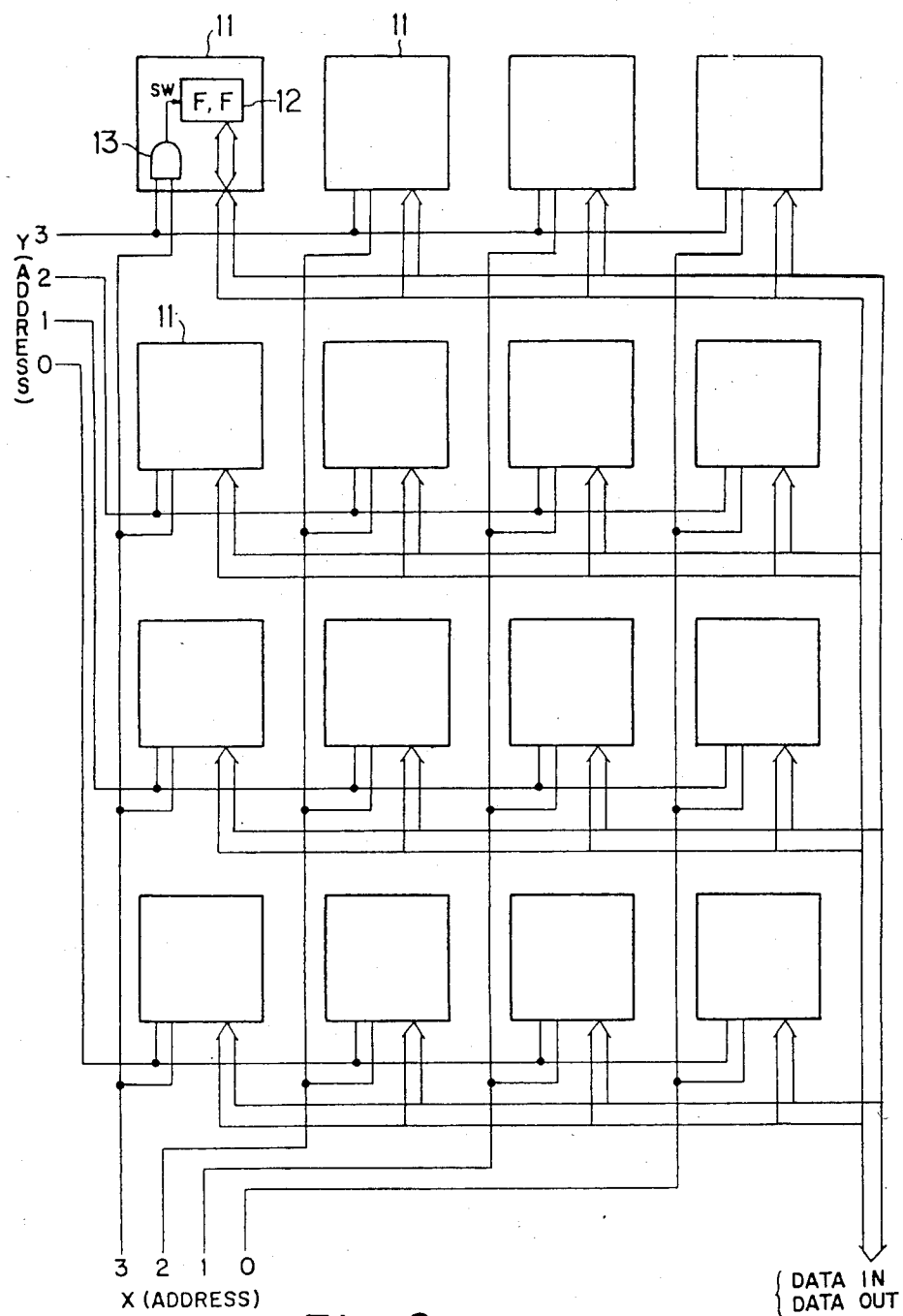
FIG. 2 shows an internal structure of the memory of FIG. 1.

The following is a listing of the reference numerals utilized in FIGS. 1–10.

1,4: memory; 2,5,6: X decoder; 3,7,8: Y decoder; 9,20: the first address line; 10,19: the second address line; 21: first input/output data line; 22: second input/output data line; 12,42: flip-flop; 43: selecting switch; 11,41: memory cell.

BEST MODE FOR CARRYING OUT THE INVENTION

Figure 4:
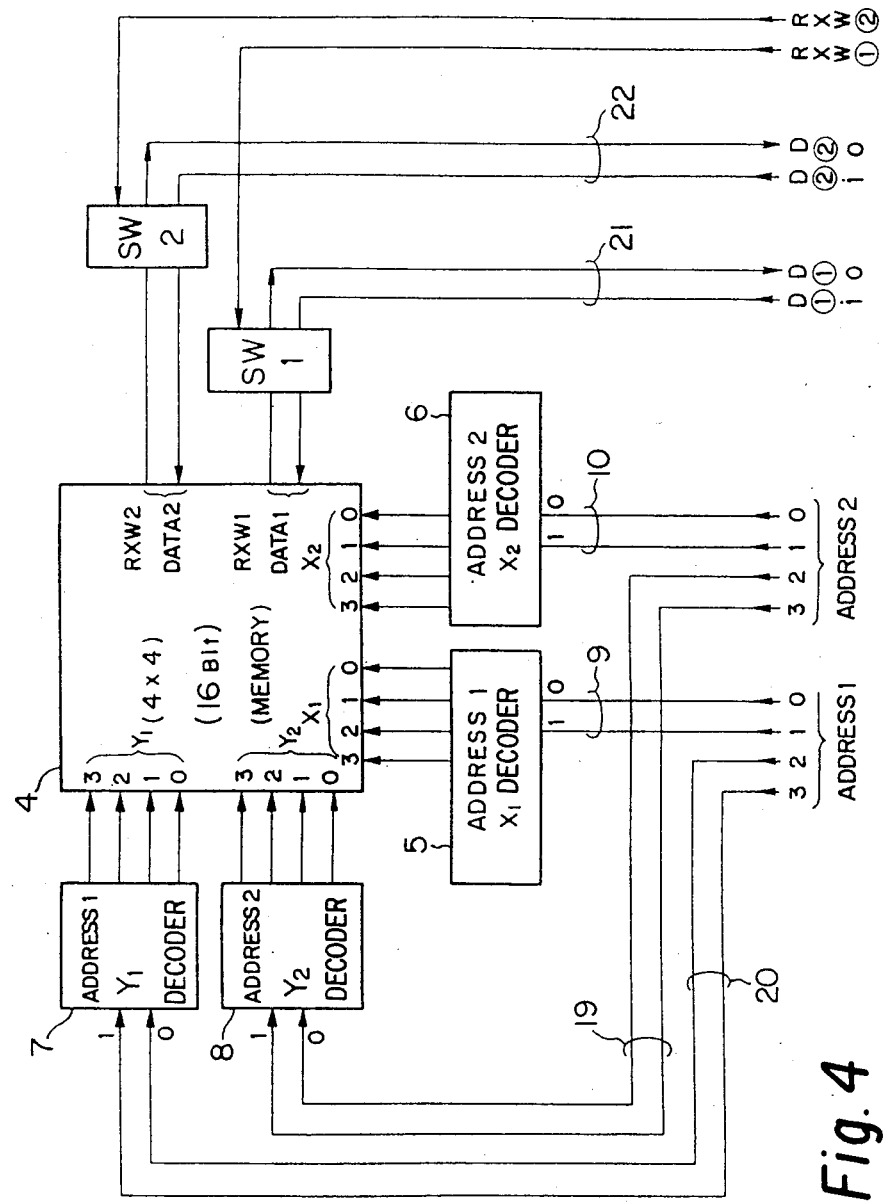
FIG. 4 shows the structure of the multiple simultaneous access memory to illustrate the present invention.

FIG. 4 shows the structure of multiple simultaneous access memory to illustrate the present invention.

FIG. 4 has two X decoders 5 and 6, Y decoders 7 and 8, X address control lines 9 and 10, Y address control lines 19 and 20, and input/output lines 21 and 22.

The memory 4 comprises memory cells of $4 \times 4 = 16$ bits, and monodirection of each one bit for input/output data lines, that is, multiple independent data lines. Of course, the device comprising memory cells of 32 bits or 64 bits may have bidirection for data lines, that is, input/output data passing only one line instead of two lines.

FIG. 4 uses each a couple of address control lines to specify simultaneously address, and simultaneously to access the memory cell. In this case, the corresponding input/output data lines turns on, and either one of input or output data is valid, depending on which the specifying line commands to read or write.

If the addressed two cells are different, the different input/output data lines are used for reading or writing, resulting in no problem. Even if the addressed two cells are the same, in case that both commands therefor are to read, or in case that one of the two commands is to read, there will be no problem because the stored data is not changed. However, if the addressed cells are the same, and both commands are to write, and different, that is, one is "1" and the other "0", the resulting stored data can not be sure, and therefore, writing should be suppressed if such state is inspected FIG. 5 shows the internal structure of the memory device of FIG. 4.

Sixteen memory cells 41 are arranged, each couple of which are connected to each couple of X-coordinate address lines(X1,X2) and Y-coordinate address lines(Y1,Y2), and further to a couple of input/output data lines 1, 2. Input/output data lines 1, 2, are controlled by signal on the not-shown read/write control lines.

In the memory cell 41, when the cell is selected by the first addressing, AND gate 45 is open. Then, upon the second addressing, AND gate 46 is open to activate the flip-flop 42 through OR gate 44. Simultaneously, the stored data of flip-flop 42 is read, or the information on input/output data line is written in flip-flop 42 depending on the order of the corresponding read/write control line. 43 is a selecting switch.

Figure 5:
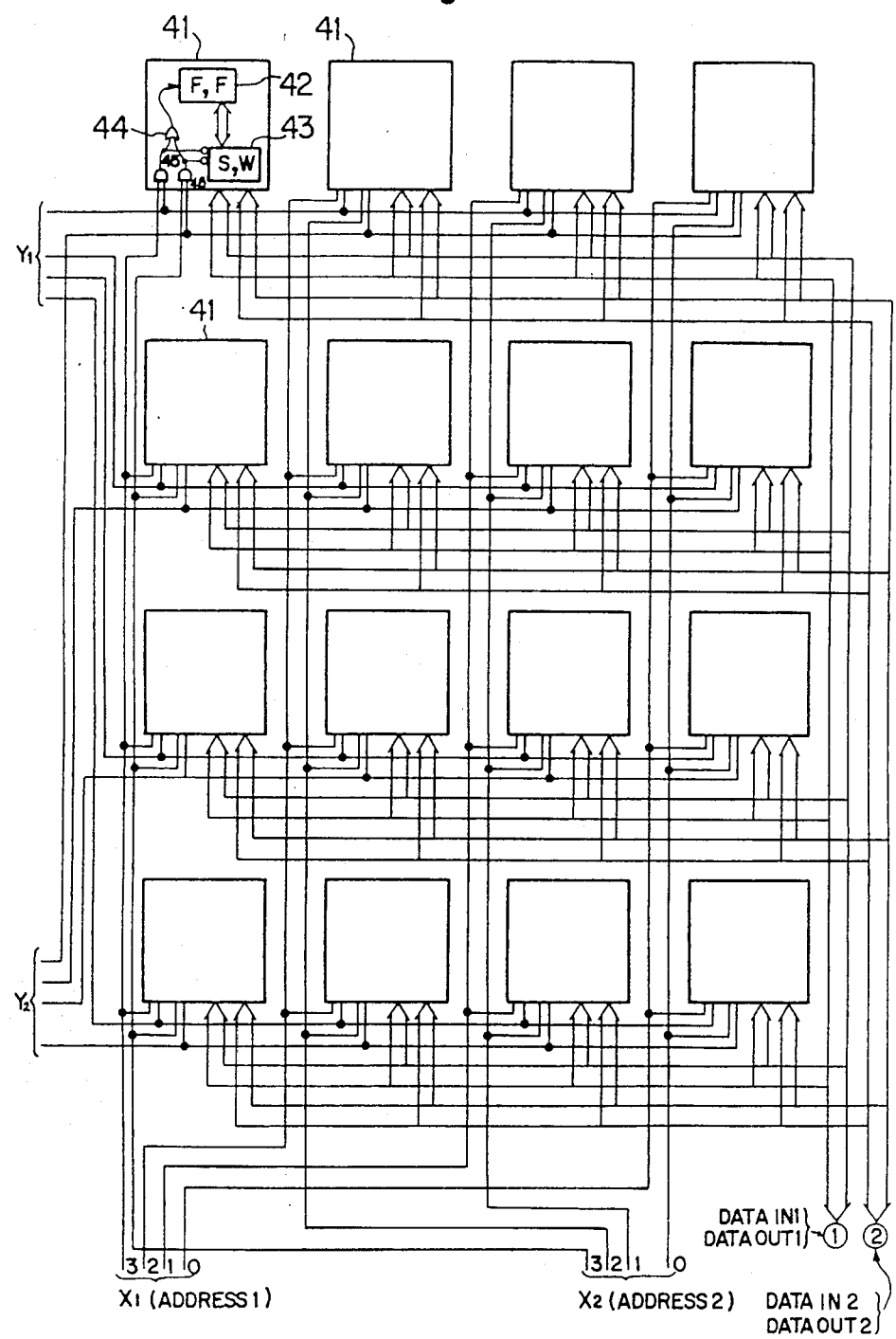
FIG. 5 shows the internal structure of the memory to FIG. 4.
Figure 6:
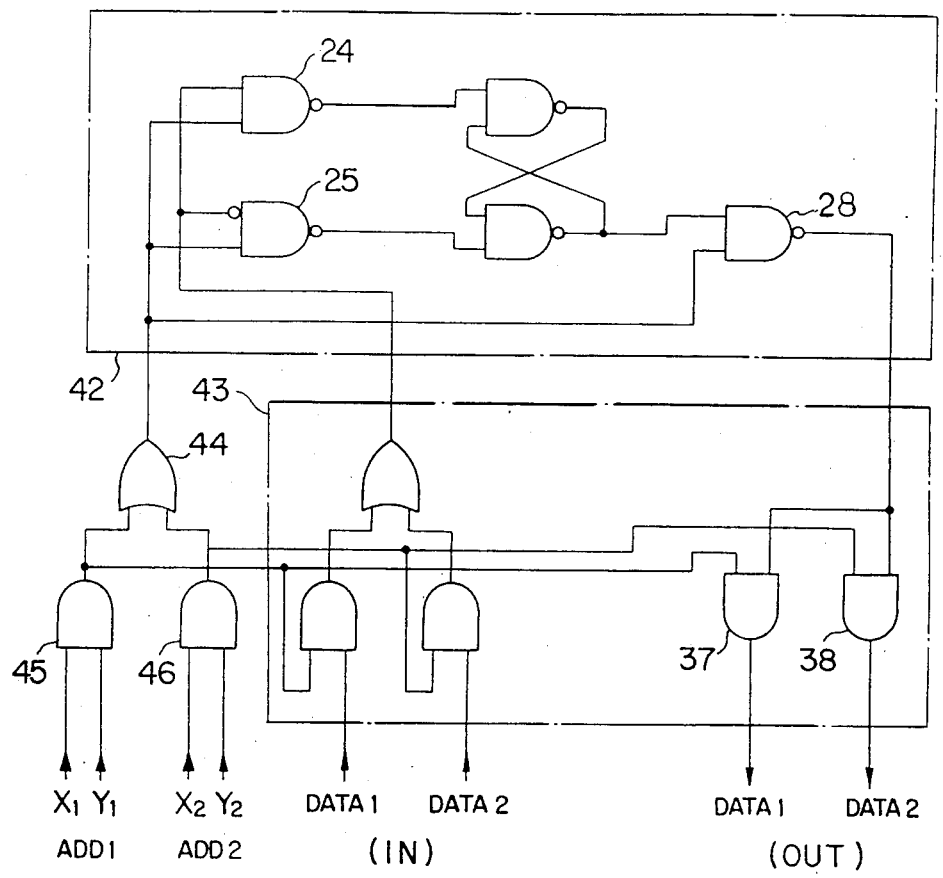
FIG. 6 shows the logical circuit diagram of the flip-flop in the device of FIG. 5.

FIG. 6 shows the logical diagram of the flip-flop in FIG. 5.

Figure 3:
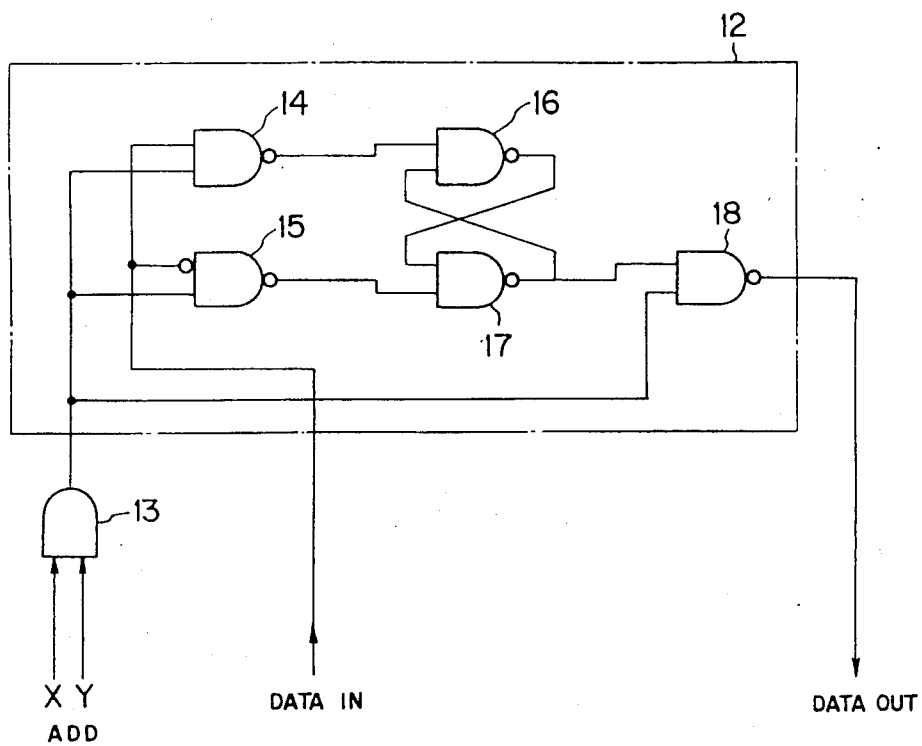
FIG. 3 shows a logical circuit of the flip-flop in the device of FIG. 2.

When the first instruction through X1, Y1 is applied to AND gate 45, the output of "1" is sent to OR gate 44. When the second instruction through address X2,Y2 is applied to AND gate 46, the output of "1" is sent to OR gate 44. Therefore, when only the first instruction is done to this flip-flop 42, or when only the second instruction is applied, or when both of the first and the second instructions on addressing select this flip-flop 42, the quite same output signal of "1" is sent from the OR gate 44 to the NAND gates 24 and 25 which is the entrance of flip-flop 42. The internal structure of flip-flop 42 is similar to that of the conventional circuit as shown in FIG. 3 except of that switch 43 is newly provided to select a control signal applied to each NAND gates 24 and 25. When the instruction on address X1,Y1 selects flip-flop 42, and the corresponding read/write control lines order to write, the input data(DATA IN 1) becomes effective, and the output data(DATA OUT 1) becomes invalid. When the control signal is to read, the output data(DATA OUT 1) becomes valid, and the input data(DATA IN 1) invalid.

On the other hand, in case of that addressing X2,Y2 selects flip-flop 42, the input data(DATA IN 2) be valid, when the command is to write, but the output data(DATA OUT 2) be valid when the command is to read. In case of that both of addressing X1,Y1 and X2,Y2 select the flip-flop 42, the input data(DATA IN 1,2) be valid when the command is to write, but the output data(DATA OUT 1,2) be valid when to read.

In case of that both of commands to address through X1,Y1 and X2,Y2 are to write or to read, the operation of flip-flop 42 is similar to that of the conventional circuit as shown in FIG. 3 and therefore, the explanation thereof is omitted. Next, in case of that one is to read, and the other is to write, the outputs from NAND gates 24 and 25 are respectively "0" and "1" or "1" and "0", depending on the stored data. Simultaneously, the data "1" or "0" stored in the latched circuit are read through NAND gate 28 and AND gates 37 and 38.

FIGS. 4–6 show the embodiment with two addressings, however, there can be provided three or more of each of decoders, address control lines, read/write control lines, and therefore, any desired number of addressing can be obtained.

In accordance with the present invention, the waiting time of access request can be eliminated, so that quick transfer of data can be produced, and further, multiple processing of memory can be obtained, and furthermore, buffer transfer at issuing input/output instructions can be independent from the main processing in CPU.

Next, the application embodiments of the present invention will be illustrated.

Figure 7:
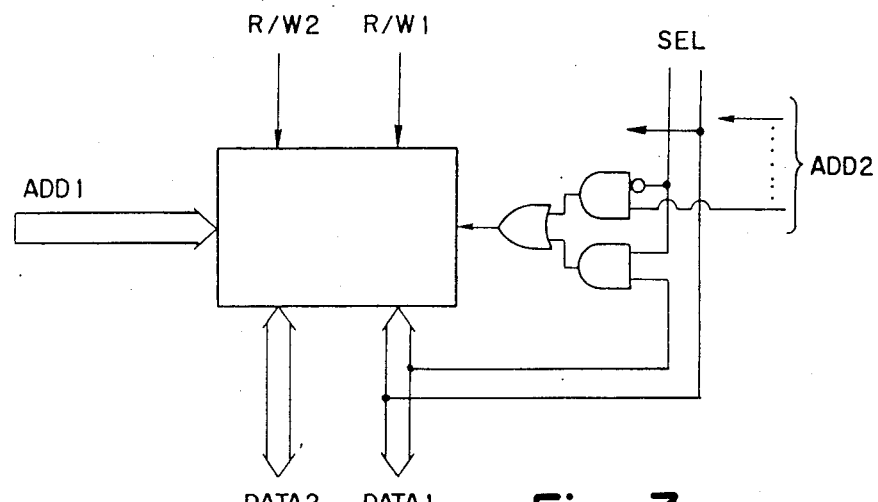
FIGS. 7 and 8 show respectively the connecting diagram in the first application of the inventive device.
Figure 8:
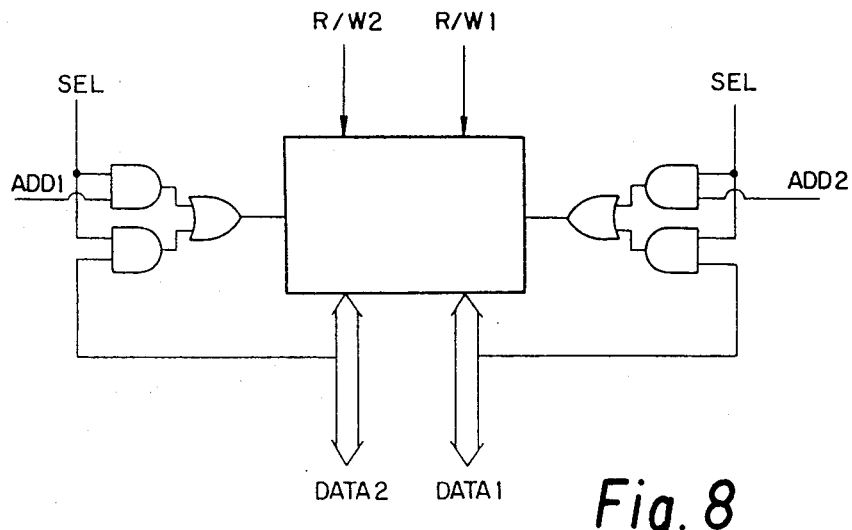

FIGS. 7 and 8 show respectively a logical diagram of the first application embodiment of the present invention.

In case of that two addresses can be instructed, the output of the data line(DATA 1) is connected directly to address line(ADD2) through gate circuit as shown in FIG. 7 or the output of the data line(DATA2) also is connected directly to address line(ADD1) through gate circuit, provided that the number of data lines is equal to or more than the number of the address lines. If the number of the data lines is less than that of the address lines, complement of address line number by page register and the like is needed.

Figure 9:
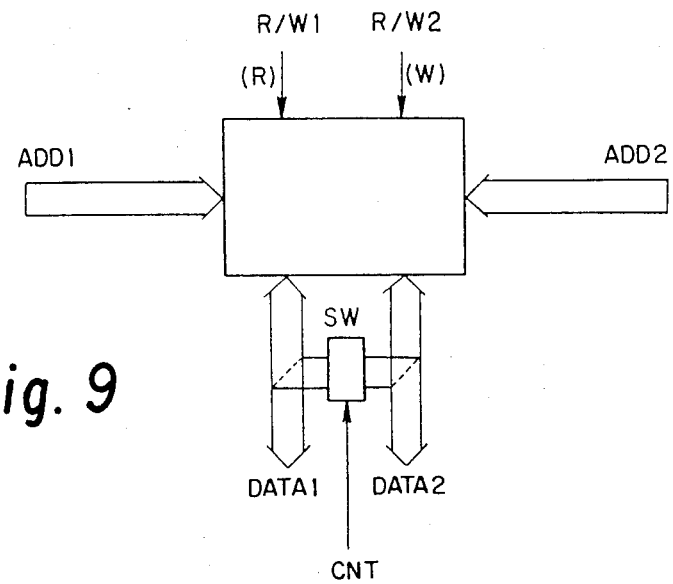
FIG. 9 shows the connecting diagram used in the second application.

In FIGS. 7 and 8, even in case of indirect addressing, data can be obtained from memory, without using CPU. In other wording, in the indirect instrustions, the first operation specifies a memory location where it is stored, and then, the stored data is interpreted to be used for addressing, therefore, the intermediate processing in CPU is necessary. On the contrary, in accordance with the present invention, the stored data which has been read upon the first addressing can access instantly memory as a second address, therefore, processing in CPU is not necessary, and further, quick accessing is possible. In FIG. 7, the address(ADD) specifies indirect address (address where data on the first address of the corresponding data is stored), instruction to read(R/W1) is done to use data(DATA1) corresponding to address(ADD1) as a direct address(ADD2). Data(DATA2) specified by address(ADD2) is the needed data. Note that if selecting signal(SEL) is "0", the second address(ADD2) differently specified is used for access, but if selecting signal(SEL) is "1", the specified second address(ADD2) is stopped, and data(DATA) is sent through gate circuit to be used as address to access memory. The dotted line indicates the case where all of multi-bit data(DATA1) are used for addressing. FIG. 9 shows the connecting diagram used in the second application of the present invention.

In FIG. 9, a data line(DATA1) and another data line(DATA2) are connected through gate circuit(SW), thereby data transfer is directly carried out without use of CPU. When the first addressing(ADD1) is executed with command to read, together with execution of the second addressing(ADD2) with command to write, and control signal(CNT) opens gate circuit(SW), data read through data line(DATA1) is sent through gate circut(SW) to data line(DATA2), and then to the location addressed by the second addressing(ADD2), to be stored therein. Thereby, data transfer in memory can be possible. When control signal(CNT) closes gate circuit(SW), the ordinary multiple simultaneous parallel access can be executed.

Figure 10:
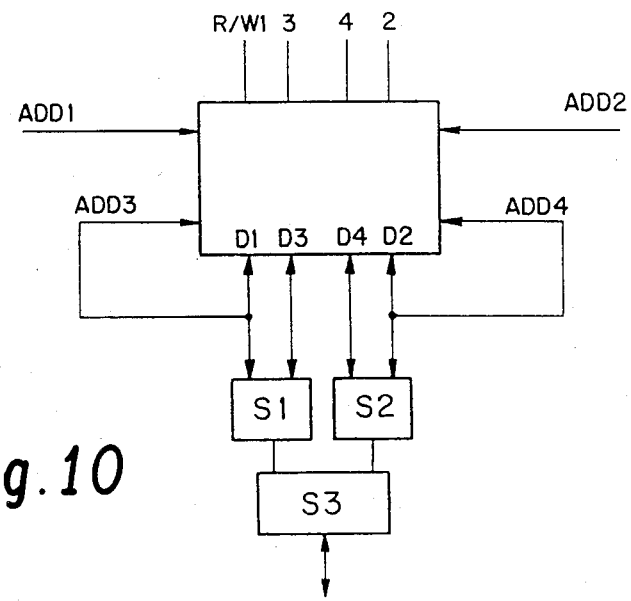
FIG. 10 shows the connecting diagram in the third application.

FIG. 10 shows the connecting diagram to be used in the third application of the present invention.

FIG. 10 is the combination of the applications shown in FIGS. 8 and 9. The address lines of ADD1 and ADD2 are used for commands from outside, and the address lines of ADD3 and ADD4 are used for addressing by data read through data lines of D1 and D2, read/write commands are sent through control lines(R/W1,2,3,&4). Switch(S1) is used to connect data line(D1) with data line(D3), and switch(S2) is used to connect data line(D2) with data line(D4). Further, they are used for selecting connections among data lines(D1,D2,D3&D4), thereby, to connect to the outside through switch(S3). Furthermore, switch(S3) can be used to connect data line(D1) with data line(D2 or D4), or data line(D3) with data line(D2 or D4).

In accordance with the present invention, data read through data line(D1) can be written in the location addressed by ADD3, and simultaneously the data read through data line(D4) is sent through switch(S2) to data line(D2) to execute write addressing(R/W2), thereby, to allow multiple processing such as writing in memory.

In this case, the bit number of each address line need not to be the same, such as, ADD1 having 0-7 bits, but ADD2 having 0-5. Further, each data line may have different bit number. Memory may include one tip device, or multi-tip device. Further, data line is explained in case of two-way line, but is may be one way line. Each application was illustrated in case of two lines of data line, but it may be three or more lines. The inventive device does not exclude RAM and ROM. In case of ROM, there is not any of read/write control line and data line, therefore, the circuit may be simplified, and there is no need of processing for multi-addressing to the same location. Multi-address lines does not need to cover entire addresses of the memory. For example, when memory has 128 bits with two address lines A and B, A covers 0-128 addresses but B covers only 11-42 addresses. In this case, less number of B's address lines can simplify the circuit, and further, double access on the necessary locations in the memory can be produced.

It is to be noted that in accordance with the present invention, multiple addresses can be simultaneously accessed, and therefore, multiple processing of memory and high speed data transfer can be enabled, and further, buffer transfer by input/output device can be executed independently from the main processing by CPU.

I claim:

1. A memory matrix for simultaneously reading or writing information from or onto at least two cells of the memory matrix, each cell having a different address, comprising:

a matrix of memory cells;

a plurality of data buses connected to each of said memory cells, each of said data buses provided with a data input line and a data output line;

a plurality of XY address buses connected to each of said memory cells, the number of said address buses corresponding to the number of said data buses;

a plurality of independent X address decoders, a single X address decoder for each of said X address buses;

a plurality of independent Y address decoders, a single Y address decoder for each of said Y address buses;

a plurality of switching circuits, each of said switching circuits provided for each of said cells and connected to each of said plurality of data buses;

a plurality of read/write control lines connected to said plurality of switching circuits, and thereby to each of said memory cells;

a first selection line connected to a first of said XY address buses; and connecting means between said first of said XY address buses and a second non-corresponding data bus for utilizing information provided from said memory matrix for addressing said matrix.

2. The memory matrix in accordance with claim 1, wherein each of said memory cells comprises:

an AND gate connected to each of said XY address buses;

an OR gate connected to the outputs of each of said AND gates;

one of said plurality of switching circuits connected between the outputs of said AND gates and said plurality of data buses, said switching circuit including a data input circuit connected to each of said data input lines and a data output circuit connected to each of said data output lines;

a flip-flop connected between the output of said OR gate and one of said plurality of switching circuits, wherein the output of said data input circuit of said switching circuit is connected to the input of said flip-flop and the output of said flip-flop is connected to said data output circuit.

3. The memory matrix in accordance with claim 2 further including a gate circuit between said data buses for transferring data between said memory cells.

4. The memory matrix in accordance with claim 1 further including:
 a second selection line connected to a second of said XY address buses; and
 connecting means between said second of said XY address buses and a first non-corresponding data bus for utilizing information provided from said memory matrix for addressing said matrix.

5. The memory matrix in accordance with claim 1 further including a gate circuit between said data buses for transferring data between said memory cells.

* * * * *